United States Patent
Wang et al.

(10) Patent No.: US 10,388,769 B2
(45) Date of Patent: *Aug. 20, 2019

(54) PARASITIC CAPACITANCE REDUCING CONTACT STRUCTURE IN A FINFET

(71) Applicant: International Business Machines Corporation, Armonk, NY (US)

(72) Inventors: Miaomiao Wang, Albany, NY (US); Tenko Yamashita, Schenectady, NY (US); Chun-chen Yeh, Clifton Park, NY (US); Hui Zang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/815,626

(22) Filed: Nov. 16, 2017

(65) Prior Publication Data
US 2018/0076304 A1    Mar. 15, 2018

Related U.S. Application Data

(63) Continuation of application No. 15/230,871, filed on Aug. 8, 2016, now Pat. No. 10,038,076.

(51) Int. Cl.
| | |
|---|---|
| *H01L 29/08* | (2006.01) |
| *H01L 29/66* | (2006.01) |
| *H01L 21/768* | (2006.01) |
| *H01L 29/417* | (2006.01) |

(Continued)

(52) U.S. Cl.
CPC .. *H01L 29/66795* (2013.01); *H01L 21/76877* (2013.01); *H01L 21/76895* (2013.01); *H01L 21/76897* (2013.01); *H01L 21/76898* (2013.01); *H01L 21/823418* (2013.01); *H01L 21/823431* (2013.01); *H01L 21/823437* (2013.01); *H01L 21/823475* (2013.01); *H01L 29/0847* (2013.01);

(Continued)

(58) Field of Classification Search
None
See application file for complete search history.

(56) References Cited

U.S. PATENT DOCUMENTS

| | | | |
|---|---|---|---|
| 10,038,076 B2 * | 7/2018 | Wang | H01L 29/66795 |
| 2013/0275935 A1 * | 10/2013 | Rashed | G06F 17/5031 |
| | | | 716/113 |
| 2015/0041854 A1 * | 2/2015 | Wang | H01L 29/0653 |
| | | | 257/190 |

OTHER PUBLICATIONS

Appendix P, 2017.

* cited by examiner

*Primary Examiner* — Jay C Chang
(74) *Attorney, Agent, or Firm* — Garg Law Firm, PLLC; Rakesh Garg; Grant Johnson

(57) ABSTRACT

In a fin-Field Effect Transistor (finFET), a recess is created at a location of a fin, the fin being coupled to a gate of the finFET, the recess extending into a substrate interfacing with the gate. The recess is filled at least partially with a first conductive material. The first conductive material is insulated from the gate. The fin is replaced with a replacement structure. The replacement structure is electrically connected to the first conductive material using a second conductive material. The second conductive material is insulated from a first surface of the finFET. A first electrical contact structure is fabricated on the first surface. A second electrical contact structure is fabricated on a second surface of the finFET, the second surface being on a different spatial plane than the first surface.

16 Claims, 14 Drawing Sheets

(51) Int. Cl.
*H01L 29/423* (2006.01)
*H01L 21/8234* (2006.01)
(52) U.S. Cl.
CPC .... *H01L 29/41791* (2013.01); *H01L 29/4232* (2013.01); *H01L 29/66545* (2013.01)

PARASITIC CAPACITANCE REDUCING CONTACT STRUCTURE IN A FINFET

TECHNICAL FIELD

The present invention relates generally to a method, system, and computer program product for reducing parasitic capacitance in semiconductor devices. More particularly, the present invention relates to a method, system, and computer program product for parasitic capacitance reducing contact structure in a fin-Field Effect Transistor.

BACKGROUND

An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in hard plastic, forming a "package". The components in modern day electronics generally appear to be rectangular black plastic packages with connector pins protruding from the plastic encasement. Often, many such packages are electrically coupled so that the chips therein form an electronic circuit to perform certain functions.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto wafer. During the photolithographic printing process, radiation is focused through the mask and at certain desired intensity of the radiation. This intensity of the radiation is commonly referred to as "dose". The focus and the dosing of the radiation has to be precisely controlled to achieve the desired shape and electrical characteristics on the wafer.

An IC may use many layers of silicon to implement a circuit. In other words, components forming the circuit may be placed on different layers of silicon in a chip. Interconnects connecting the components on one layer to components on different layers go through the silicon layer. Such interconnects are also known as through silicon vias (TSVs).

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A Field Effect Transistor (FET) is a semiconductor device that has controls the electrical conductivity between a source of electric current (source) and a destination of the electrical current (drain). The FET uses a semiconductor structure called a "gate" to create an electric field, which controls the shape and consequently the electrical conductivity of a channel between the source and the drain. The channel is a charge carrier pathway constructed using a semiconductor material.

Many semiconductor devices are planar, i.e., where the semiconductor structures are fabricated on one plane. A non-planar device is a three-dimensional (3D) device where some of the structures are formed above or below a given plane of fabrication.

A fin-Field Effect Transistor (finFET) is a non-planar device in which a source and a drain are connected using a fin-shaped conducting channel (fin) above the insulator layer. In an FET, a gate has a source-side and a drain-side. Generally, a finFET is fabricated as a multi-gate device in which two or more gates are coupled using one or more fin structures by connecting a drain of one gate to the source of another gate using a fin. For example, a fin of a finFET is usually fabricated between two gates such that the source of one gate is on one side of the fin and the drain of the other gate is on an opposite side of the fin. The direction along the lateral length of the fin running from one gate to the other gate is referred to herein as a lateral running direction of the fin.

A CB contact is an electrical connection that connects two gates. A CB contact is fabricated on one surface—usually the top surface (also referred to herein as the frontside) of the device. A circuit external to the finFET uses the CB contact to electrically connect a part of the circuit to a gate in the finFET. The frontside of the finFET is the side opposite to the side of the gate facing the substrate of the device. The side of the gate facing the substrate is referred to herein as the backside of the device.

A TS contact is an electrical contact that provides electrical connectivity to the one or more fins that connect two or more gates to one another. Presently, the TS contact is also fabricated on the same surface as the CB contact, although electrically insulated from the CB contact. A circuit external to the finFET uses the TS contact to electrically connect a part of the circuit to a fin in the finFET.

The illustrative embodiments recognize that the present methods and techniques for fabricating a finFET suffer from several problems. For example, placing the CB contact and the TS contact on the same surface causes the only separation between the two contacts to be the fabricated distance between them. Given that these devices are extremely small—of the order of a few nanometers, presently manufactured using 14 nanometer (nm) technology—creates a risk of short circuit between these contacts. Furthermore, the insulation separating two conducting contacts on the same surface also creates an unintended capacitor, which gives rise to undesirable—parasitic—capacitance in the finFET device.

The illustrative embodiments further recognize that fabricating a finFET contact in places other than the surface where they are presently located is difficult given the non-planar geometry of the finFET device. Therefore, a method for fabricating the CB and TS contacts on different surfaces of a finFET would be useful.

SUMMARY

The illustrative embodiments provide a method, system, and computer program product. An embodiment includes a method that creates, in a fin-Field Effect Transistor (finFET), a recess at a location of a fin, the fin being coupled to a gate of the finFET, the recess extending into a substrate interfacing with the gate. The embodiment fills the recess at least partially with a first conductive material. The embodiment insulates the first conductive material from the gate. The embodiment replaces the fin with a replacement structure. The embodiment connects electrically, using a second conductive material, the replacement structure to the first conductive material. The embodiment insulates the second conductive material from a first surface of the finFET. The embodiment fabricates a first electrical contact structure on the first surface. The embodiment fabricates a second electrical contact structure on a second surface of the finFET, the second surface being on a different spatial plane than the first surface. Thus, the embodiment improves the fabrication of finFET devices such that the separation between the contacts is advantageously increased in a non-planar manner without increasing the overall size of the device.

In one embodiment, the first surface and the second surface are substantially orthogonal to each other. Thus, the embodiment improves the fabrication of finFET devices such that the contacts can be advantageously placed on the non-planar surfaces almost orthogonally to one another.

In one embodiment, the first conductive material is electrically accessible on the second surface. Thus, the embodiment improves the fabrication of finFET devices such that the contacts can be advantageously placed on the first conductive material.

In one embodiment, the second conductive material is electrically accessible on the second surface. Thus, the embodiment improves the fabrication of finFET devices such that the contacts can be advantageously placed on the first conductive material.

In one embodiment, the second electrical contact structure provides a circuit electrically connectivity to the replacement structure. Thus, the embodiment improves the fabrication of finFET devices such that a circuit can be advantageously attached to the finFET using the second contact structure.

In one embodiment, the first electrical contact structure provides a circuit electrically connectivity to the gate. Thus, the embodiment improves the fabrication of finFET devices such that a circuit can be advantageously attached to a gate of the finFET using the first contact structure.

Another embodiment further fills, as a part of connecting electrically the replacement structure to the first conductive material, a second conducting material in a first portion of the recess, the second conducting material forming an electrically conducting path between the first conductive material and the replacement structure. Thus, the embodiment improves the fabrication of finFET devices such that a connection to a fin of the finFET can be brought out in a different direction from the gate contact.

Another embodiment further constructs an insulating barrier on a portion of the gate, the insulating barrier occupying a second portion of the recess. Thus, the embodiment improves the fabrication of finFET devices such that a connection to the fin is sufficiently insulated from the gate.

In one embodiment, the first conductive material and the second conductive material are identical. Thus, the embodiment improves the fabrication of finFET devices such that the same material can be used in bringing out a connection to the fin in a direction different from the gate contact.

Another embodiment further grows an epitaxy structure at the location of the fin, wherein the epitaxy structure is the replacement structure and has a semiconducting characteristic of the fin. Thus, the embodiment improves the fabrication of finFET devices such that a fin can be removed and then replaced during the fabrication to accommodate the non-planar contact placement.

Another embodiment further fills a first insulating material above the first conductive material. The embodiment adjusts a level of the first insulating material such that at least a portion of the gate becomes uncovered from the first insulating material, the portion of the gate being where the fin couples with the gate. Thus, the embodiment improves the fabrication of finFET devices such that a fin can be removed and then a replacement structure can be attached to the gates during the fabrication to accommodate the non-planar contact placement.

Another embodiment further causes, as a part of filling the recess at least partially with the first conductive material, the first conductive material to be exposed for making electrical connection with the fin. Thus, the embodiment improves the fabrication of finFET devices such that a connection to the fin-replacement structure can be made for the non-planar contact placement.

Another embodiment further adjusts a height of the first conductive material in the recess such that the first conductive material remains entirely within the substrate. Thus, the embodiment improves the fabrication of finFET devices such that a distance between a gate contact and a fin contact can be maximized.

In one embodiment, the finFET comprises a plurality of gates including the gate, and wherein a plurality of fins including the fin couple the plurality of gates. Thus, the embodiment improves the fabrication of finFET devices with multiple gates and multiple fins, such that separation between the contacts is advantageously increased in a non-planar manner without increasing the overall size of the device.

An embodiment includes a computer usable program product. The computer usable program product includes one or more computer-readable storage devices, and program instructions stored on at least one of the one or more storage devices.

An embodiment includes a computer system. The computer system includes one or more processors, one or more computer-readable memories, and one or more computer-readable storage devices, and program instructions stored on at least one of the one or more storage devices for execution by at least one of the one or more processors via at least one of the one or more memories.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
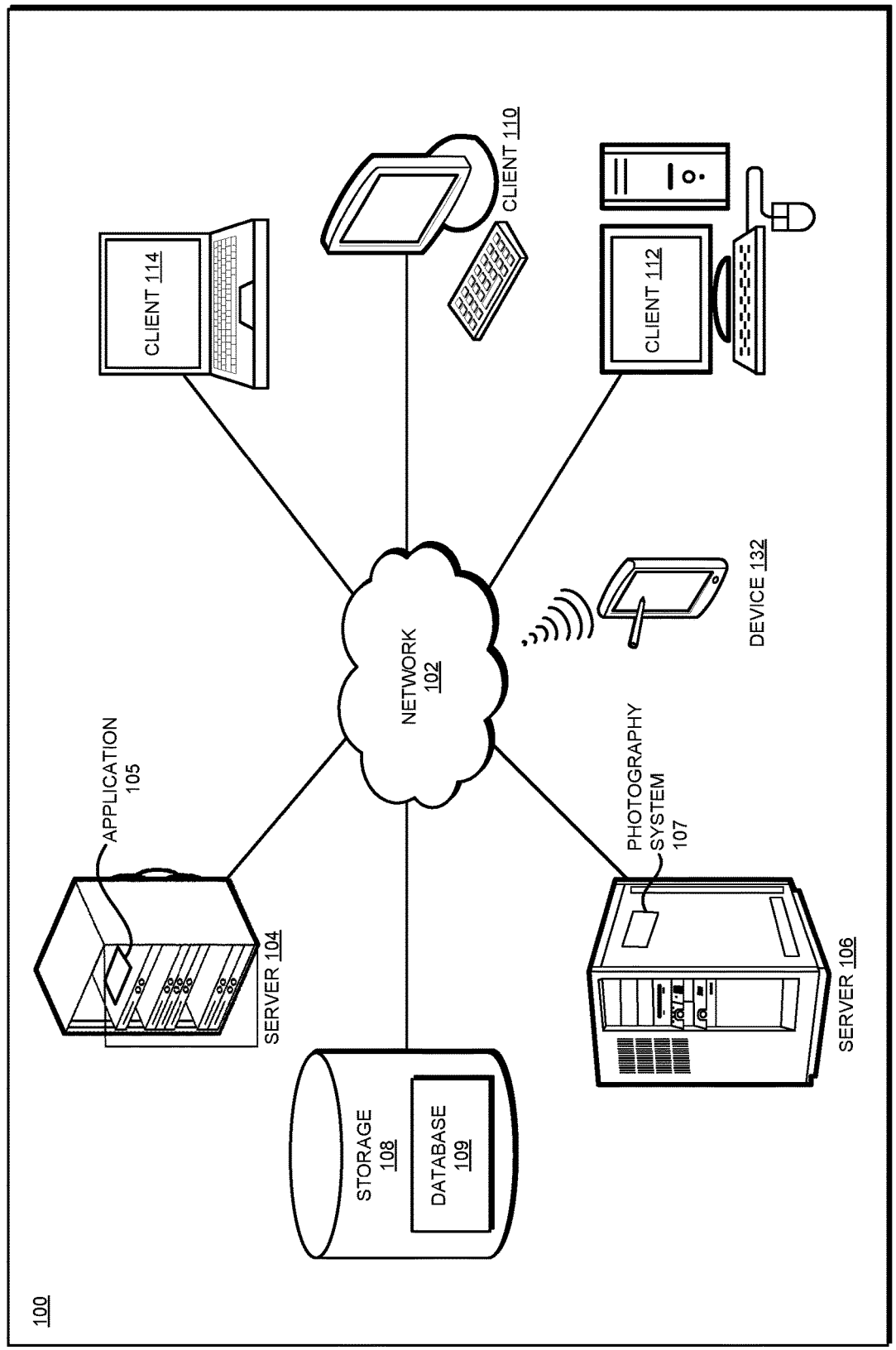
FIG. 1 depicts a block diagram of a network of data processing systems in which illustrative embodiments may be implemented.

The illustrative embodiments used to describe the invention generally address and solve the above-described problems and other problems related to fabricating a finFET. The illustrative embodiments provide a fabrication method for finFET devices that reduces the risk of short circuit between contacts, e.g., between the CB and the TS contacts, and also reduces or removes certain conditions that are conducive to undesirable parasitic capacitance.

An embodiment can be implemented as a software application. The application implementing an embodiment can be configured as a modification of an existing photolithography system, as a separate application that operates in conjunction with an existing photolithography system, a standalone application, or some combination thereof. For example, the application causes the photolithography system to perform the steps described herein, to fabricate a finFET in which certain contacts are positioned as described herein.

For the clarity of the description, and without implying any limitation thereto, the illustrative embodiments are described using a two-gate finFET where the gates are coupled using two fins. An embodiment can be implemented with a different number of gates, different number of fins, or both, within the scope of the illustrative embodiments.

Furthermore, a simplified diagram of the example finFET is used in the figures and the illustrative embodiments. In an actual fabrication of a finFET, additional structures that are not shown or described herein may be present without departing the scope of the illustrative embodiments. Similarly, within the scope of the illustrative embodiments, a shown or described structure in the example finFET may be fabricated differently to yield a similar operation or result as described herein.

Differently shaded portions in the two-dimensional drawing of the example finFET are intended to represent different structures in the example finFET, as described herein. The different structures may be fabricated using suitable materials that are known to those of ordinary skill in the art.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in actually fabricating a finFET according to the illustrative embodiments.

Furthermore, the illustrative embodiments are described with respect to a finFET only as an example. The steps described by the various illustrative embodiments can be adapted for fabricating other planar and non-planar devices in a similar manner, and such adaptations are contemplated within the scope of the illustrative embodiments. The TS and the CB contacts are also used only as non-limiting examples to describe the various operations of the illustrative embodiments. Those of ordinary skill in the art will be able to use an embodiment to increase the separation between any pair of contacts in a similar manner, and such usage with other pairs of contacts is also contemplated within the scope of the illustrative embodiments.

An embodiment when implemented in an application causes a fabrication process to performs certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a device or data processing system, comprises substantial advancement of the functionality of that device or data processing system in fabricating finFET devices where the risk of short circuit across contacts is reduced, and parasitic capacitance across contacts is also reduced. For example, presently available methods for fabricating finFET devices place the CB and TS contacts on the frontside of the device, which creates or heightens the risk of short circuit and parasitic capacitance. An embodiment provides a method for fabricating a finFET device in such a manner that different contacts are positioned on different faces or facets of the device. Such a positioning of contacts creates not just a horizontal or planar (2-dimension) distance between the contacts as in the prior-art, but a horizontal separation as well as a vertical non-planar (3-dimension) separation between the contacts. This manner of parasitic capacitance reducing contact structure in finFET is unavailable in the presently available methods. Thus, a substantial advancement of such devices or data processing systems by executing a method of an embodiment is in an improved fabrication of finFET devices where the separation between the contacts is increased in a non-planar manner without increasing the overall size of the device.

The illustrative embodiments are described with respect to certain types of devices, contacts, layers, planes, structures, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
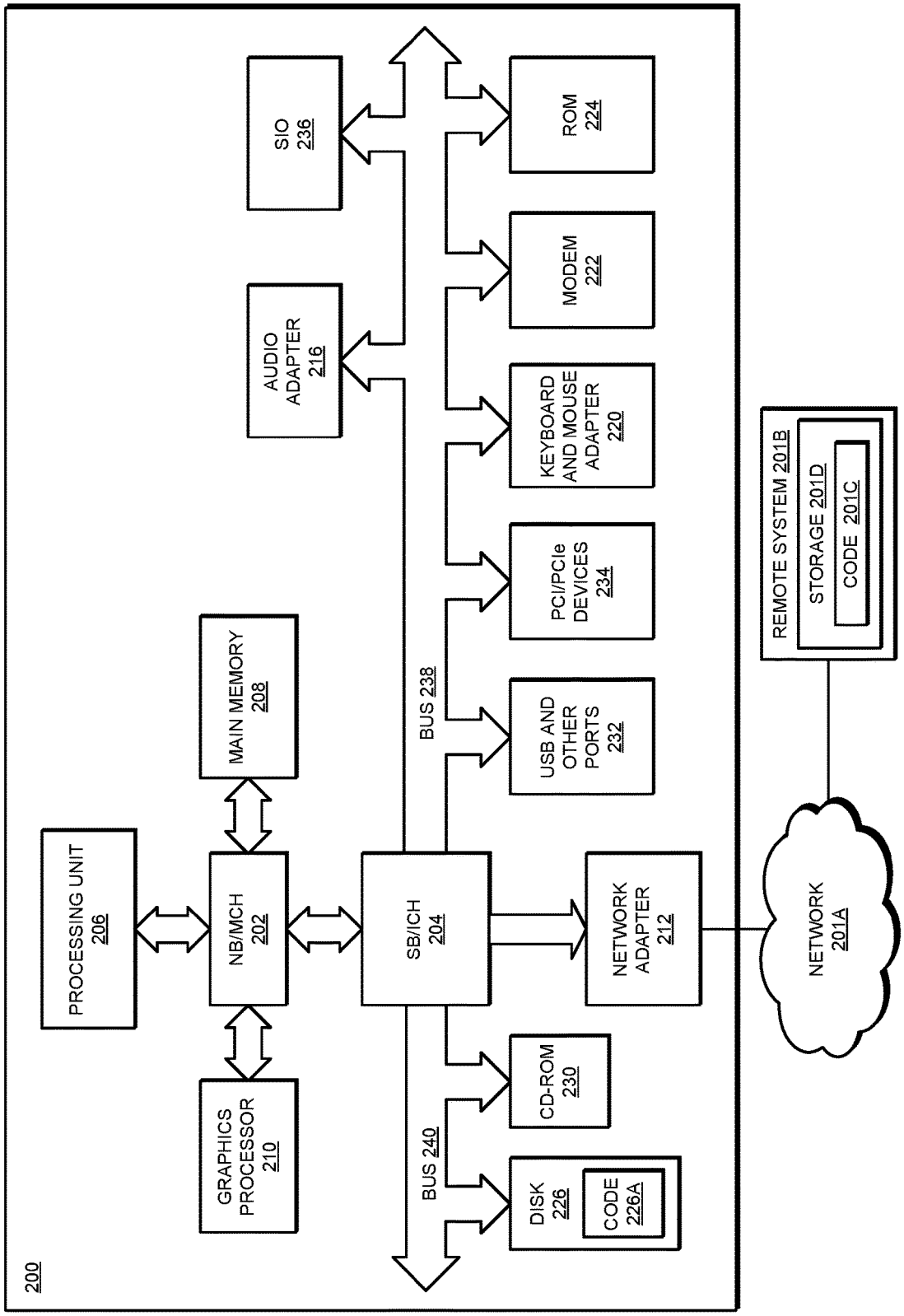
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a device described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a semiconductor device. Application 105 provides instructions to system 107 for fabricating the locations on a semiconductor device where the contacts can be positioned for improved separation, reduced risk of short circuits, reduced parasitic capacitance, or a combination thereof, in a manner described herein.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro—SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), Linux® (Linux is a trademark of Linus Torvalds in the United States and other countries), iOS™ (iOS is a trademark of Cisco Systems, Inc. licensed to Apple Inc. in the United States and in other countries), or Android™ (Android is a trademark of Google Inc., in the United States and in other countries). An object oriented programming system, such as the Java™ programming system, may run in conjunction with the operating system and provide calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. In another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

Figure 3:
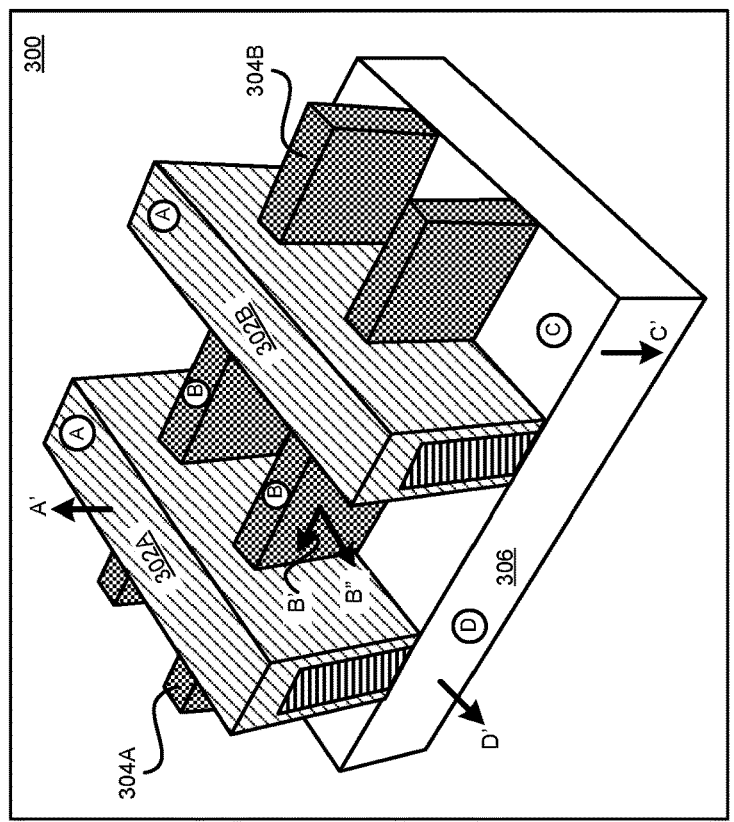
FIG. 3 depicts a block diagram of an example finFET device configuration in which the contacts have to be placed for parasitic capacitance reducing contact structure in finFET in accordance with an illustrative embodiment.

With reference to FIG. 3, this figure depicts a block diagram of an example finFET device configuration in which the contacts have to be placed for parasitic capacitance reducing contact structure in finFET in accordance with an illustrative embodiment. Application 105 in FIG. 1 interacts with fabrication system 107 to produce or manipulate configuration 300 as described herein.

Configuration 300 depicts two example gates, 302A and 302B. Configuration 300 depicts two example fins, 304A and 304B, that couple gates 302A and 302B as shown. Structures 302A, 302B, 304A, and 304B are formed over substrate 306.

Surfaces marked (A) are to be regarded as a part of the frontside of configuration 300. Contacts placed on the frontside allow connecting wires to protrude in direction (A'). Gates 302A and 302B are connected using any number of CB contacts, where a CB contact connects to a point on surface A of gate 302A and to another point on surface A of gate 302B.

Surfaces marked (B) are also to be regarded as a part of the frontside of configuration 300. Contacts placed on the frontside, including on surfaces B, allow connecting wires to protrude in direction (A'). Fins 304A and 304B are connected using any number of TS contacts, where a TS contact connects to a point on surface B of fin 304A and to another point on surface B of fin 304B.

Direction (B') is the lateral running direction of fins 304A and 304B as described herein. Direction (B") is orthogonal, or substantially orthogonal, to direction B' as shown.

Surface (C) is that surface of substrate 306, which faces gates 302A and 302B. Substrate 306 extends from surface C in the direction (C'). Surface (D) of substrate 306 is orthogonal, or substantially orthogonal, to surface C. Direction (D') is parallel to direction B". Surface A and surface D are in different spatial planes in a three-dimensional space.

Figure 4:
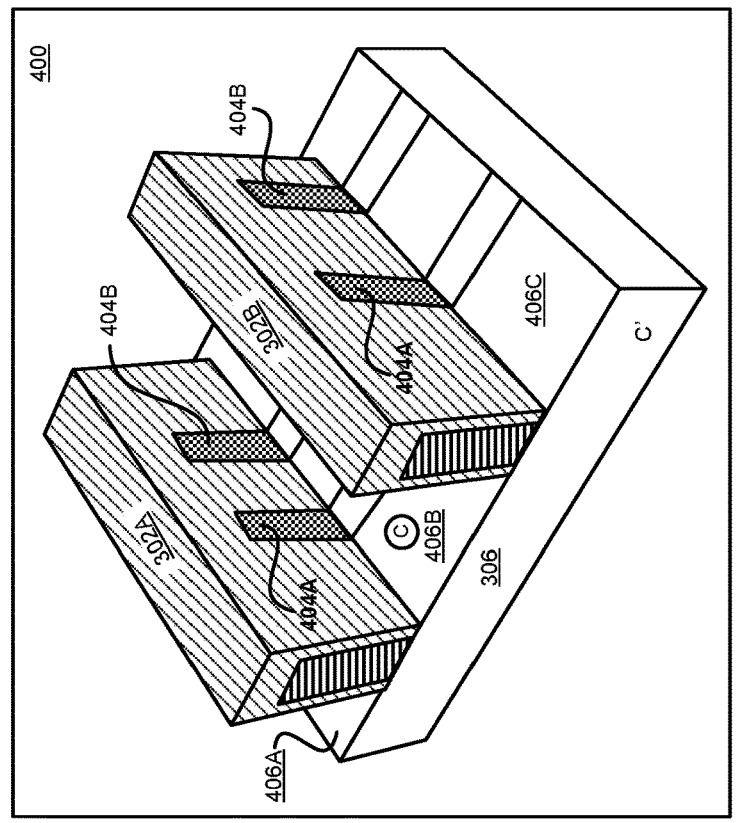
FIG. 4 depicts a block diagram of a modified example finFET device configuration for parasitic capacitance reducing contact structure in finFET in accordance with an illustrative embodiment.

With reference to FIG. 4, this figure depicts a block diagram of a modified example finFET device configuration for parasitic capacitance reducing contact structure in finFET in accordance with an illustrative embodiment. Application 105 in FIG. 1 interacts with fabrication system 107 to produce or manipulate configuration 400 as described herein.

Configuration 400 is a stage resulting from an etching step applied to configuration 300 in FIG. 3. Only as an example, fins 304A and 304B are etched between gates 302A and 302B down to surface C of substrate 306. Fin portions 404A and 404B are portions of fins 304A and 304B, respectively, that remain after the etching process. Note that the etching can occur between gates 302A and 302B, on the far-side (not visible) of gate 302A—e.g., down to section 406A of surface C, between gates 302A and 302B—e.g., down to section 406B of surface C, on the near-side of gate 302B—e.g., down to section 406C of surface C, or at some combination of any of sections 406A, 406B, and 406C.

With reference to FIG. 5, FIG. 6, FIG. 7, FIG. 8, FIG. 9, FIG. 10, FIG. 11, FIG. 12, FIG. 13, FIG. 14, FIG. 15, and FIG. 16, each of these figures depicts a block diagram of a further modified example finFET device configuration for parasitic capacitance reducing contact structure in finFET in accordance with an illustrative embodiment. Application 105 in FIG. 1 interacts with fabrication system 107 to produce or manipulate configurations 500, 600, 700, 800, 900, 1000, 1100, 1200, 1300, 1400, 1500, and 1600, respectively, as described in these figures.

Configuration 500 is a stage resulting from an etching step applied to configuration 400 in FIG. 4. Only as an example, assume fins 304A and 304B are etched between gates 302A and 302B down to section 406B of surface C in FIG. 4. Etching creates a trench of depth 506 into substrate 306 below gates 302A and 302B.

Figure 5:
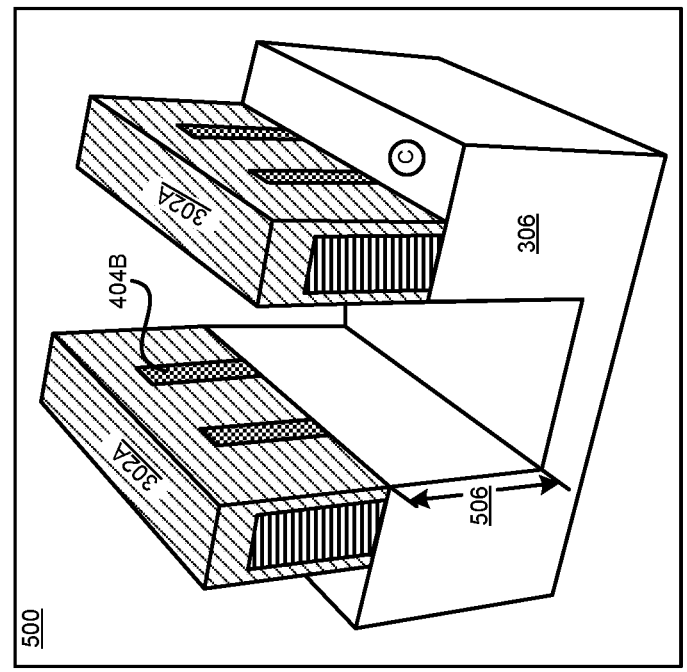
FIG. 5 depicts a block diagram of a further modified example finFET device configuration for parasitic capacitance reducing contact structure in finFET in accordance with an illustrative embodiment.

Configuration 600 is a stage resulting from a metal filling step applied to configuration 500 in FIG. 5. The trench of depth 506 depicted in FIG. 5 is filled with a conductor, e.g., a suitable metal such as Tungsten but not limited thereto. Metal 608 may reach above surface C of substrate 306 as shown, but the illustrative embodiments do not necessitate filling to such a level. For example, metal 608 may be filled into depth 506 to reach up to surface C or up to some level below surface C.

Figure 6:
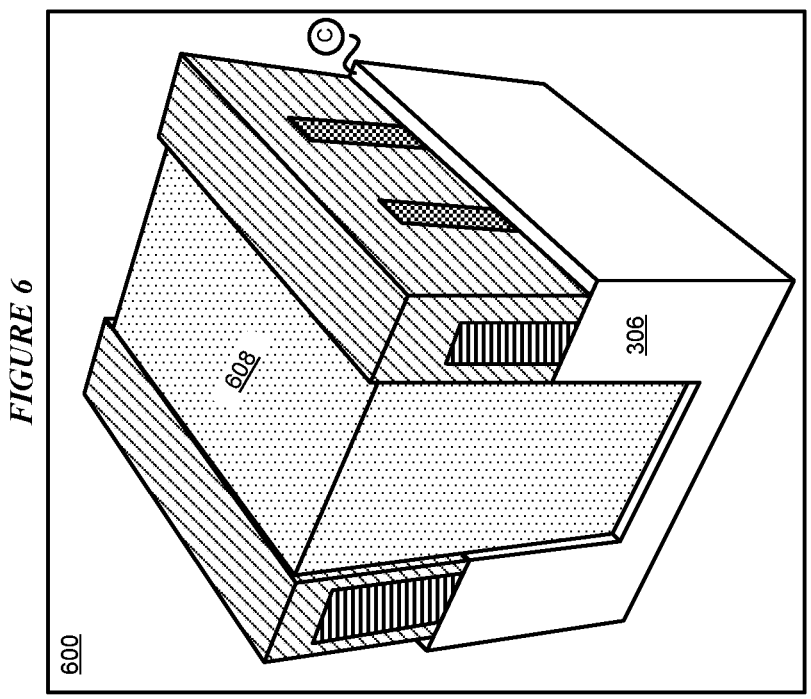
FIG. 6 depicts a block diagram of a further modified example finFET device configuration for parasitic capacitance reducing contact structure in finFET in accordance with an illustrative embodiment.

For example, configuration 700 is a stage resulting from an etching or removal step applied to configuration 600 in FIG. 6. For example, when metal 608 is filled above surface C, as depicted in configuration 600, metal 608 is etched or removed up to level 708 below surface C. If metal 608 is only filled up to level 708 in configuration 600, the removal step depicted in FIG. 7 can be omitted in some cases.

Configuration 800 is a stage resulting from an insulation filling step applied to configuration 700. For example, when metal 608 is reduced to level 708, insulator 810, such as oxide but not limited thereto, is filled above metal 608. Insulator 810 may be filled above metal 608 and up to surface A as shown, but the illustrative embodiments do not necessitate filling to such a level. Insulator 810 may be filled above metal 608 up to some level below (not shown) surface A.

Figure 8:
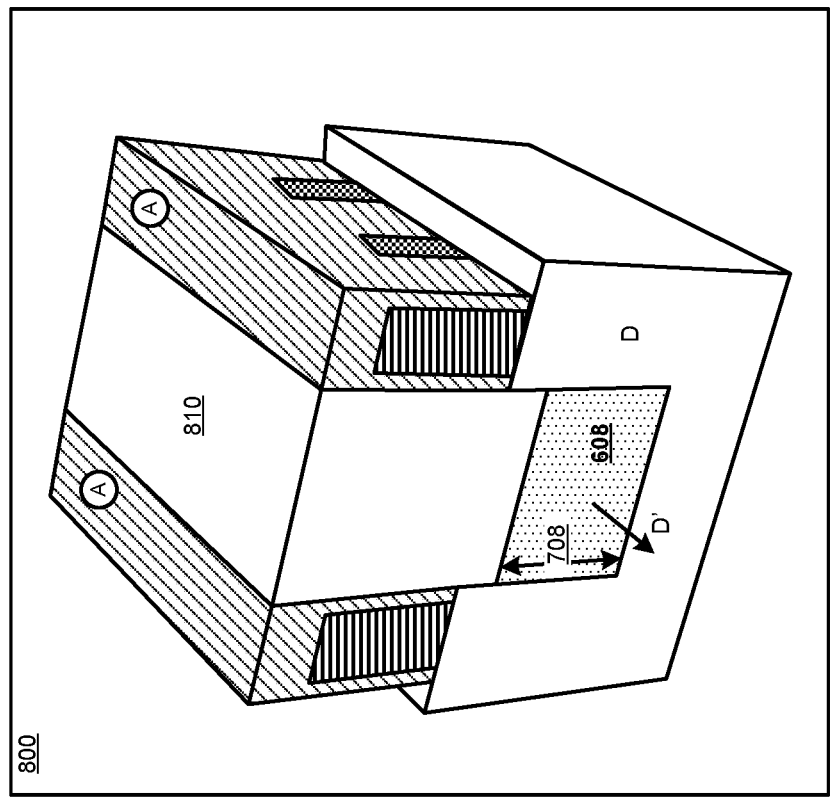
FIG. 8 depicts a block diagram of a further modified example finFET device configuration for parasitic capacitance reducing contact structure in finFET in accordance with an illustrative embodiment.
Figure 7:
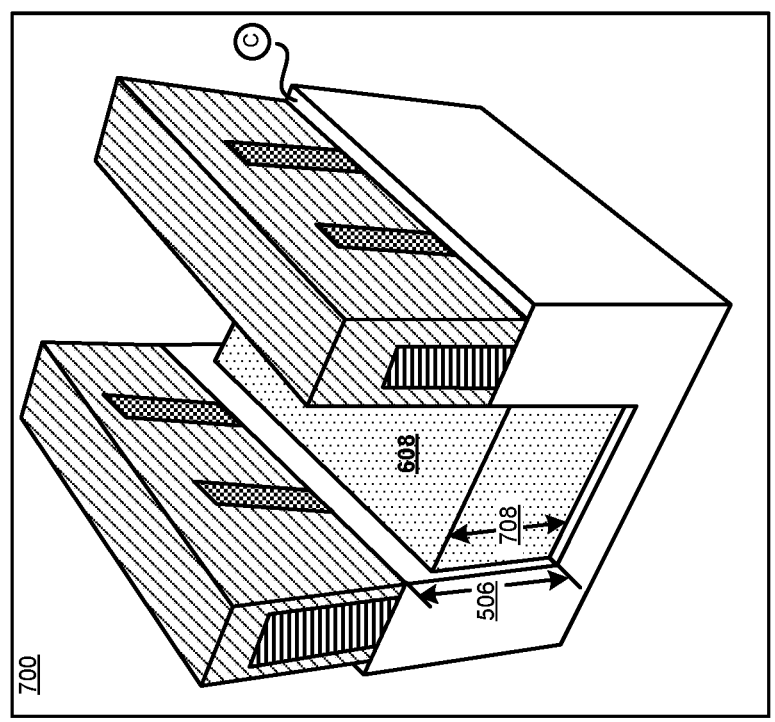
FIG. 7 depicts a block diagram of a further modified example finFET device configuration for parasitic capacitance reducing contact structure in finFET in accordance with an illustrative embodiment.

For example, configuration 900 is a stage resulting from an etching or removal step applied to configuration 800 in FIG. 8. For example, when insulator 810 is filled above surface C, as depicted in configuration 800, insulator 810 is etched or removed up to height 912 above metal 608. The purpose of leaving thickness 912 of insulator 810 above metal 608 is to insulate metal 608 from gates 302A and 302B. Thickness 912 need not exact to surface C and can be above or below surface C. Thickness 912 is implementation-specific and can be adjusted as needed within the scope of the illustrative embodiments. If insulator 810 is only filled up to thickness 912 in configuration 800, the removal step depicted in FIG. 9 can be omitted in some cases.

Configuration 1000 is a stage resulting from an epitaxy step applied to configuration 900. Epitaxy is the process of growing an epitaxial layer (referred to herein as "epi") from a precursor. Particularly, epi 1014A is grown using known methods to connect fin portion 404A in gate 302A with fin portion 404A in gate 302B. Similarly, epi 1014B is grown to connect fin portion 404B in gate 302A with fin portion 404B in gate 302B. Epi 1014A and 1014B each has conducting or semiconducting properties that are similar to fins 304A and 304B of configuration 300, respectively.

Figure 10:
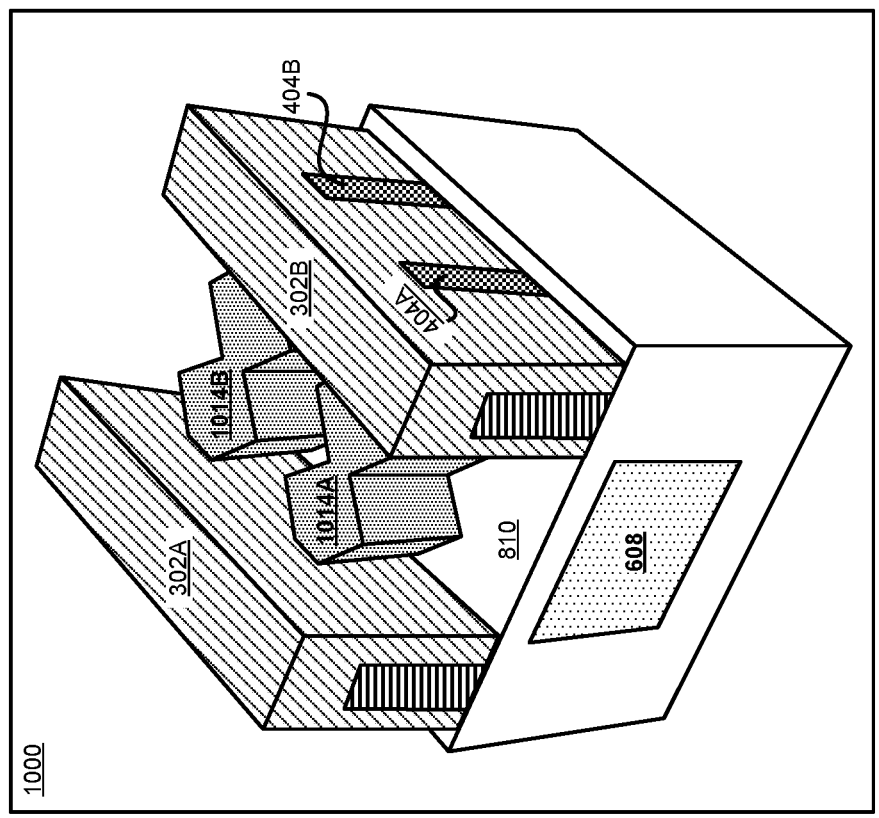
FIG. 10 depicts a block diagram of a further modified example finFET device configuration for parasitic capacitance reducing contact structure in finFET in accordance with an illustrative embodiment.
Figure 9:
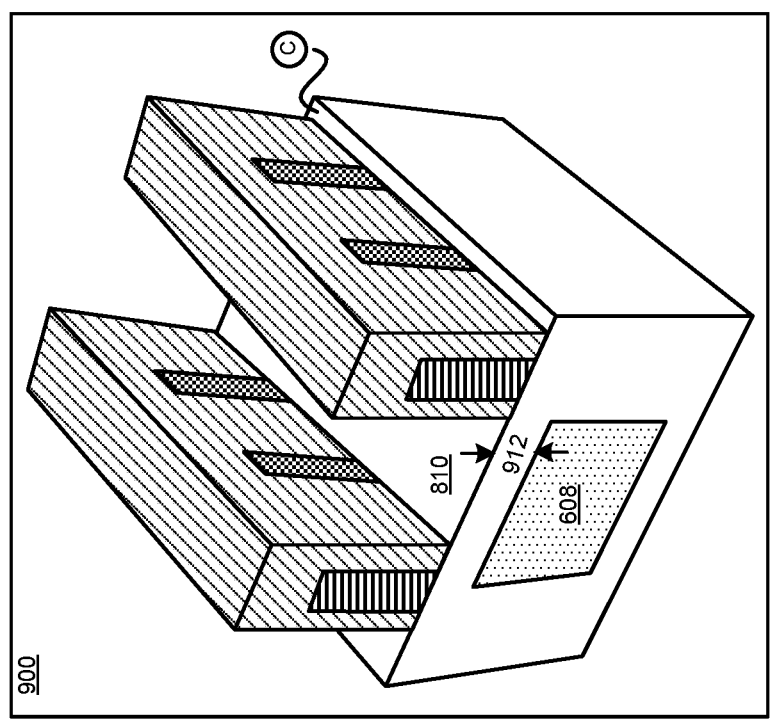
FIG. 9 depicts a block diagram of a further modified example finFET device configuration for parasitic capacitance reducing contact structure in finFET in accordance with an illustrative embodiment.

Configuration 1100 is a top view of the stage depicted in configuration 1000 in FIG. 10. Epi 1014A is shown to connect fin portion 404A in gate 302A with fin portion 404A in gate 302B. Similarly, epi 1014B is shown to connect fin portion 404B in gate 302A with fin portion 404B in gate 302B.

Configuration 1200 is a stage resulting from an insulation filling step applied to configuration 1000. For example, after epi 1014A and 1014B are grown, insulator 1210, such as oxide but not limited thereto, is filled above insulator of thickness 912. Insulator 1210 is filled at least above epi 1014A and 1014B, and preferably up to surface A as shown, such that the surfaces of gates 302A and 302B where epis 1014A and 1014B connect can be fully insulated.

Figure 12:
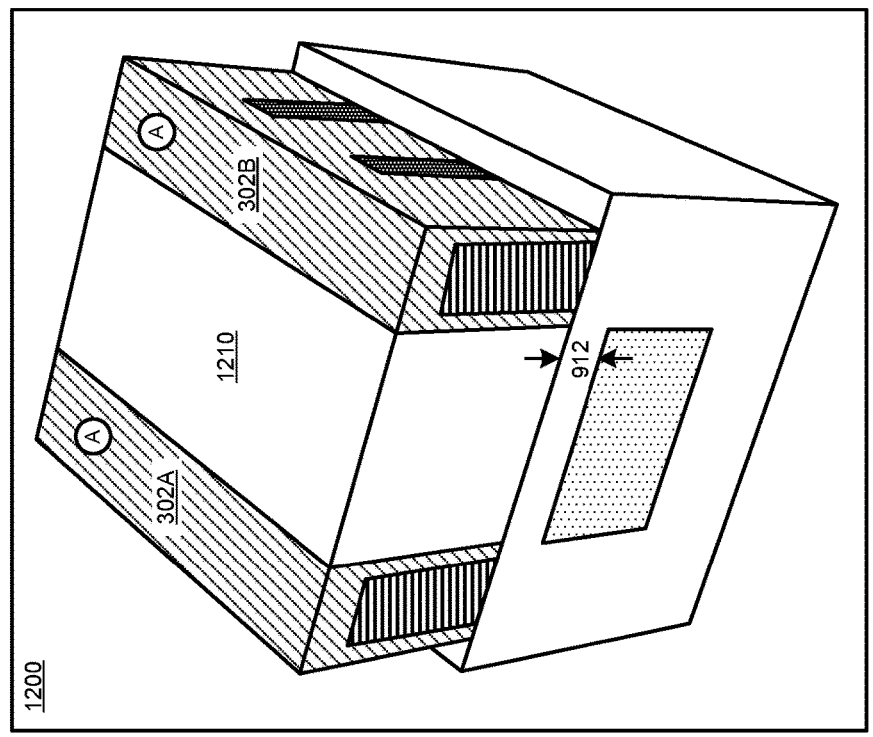
FIG. 12 depicts a block diagram of a further modified example finFET device configuration for parasitic capacitance reducing contact structure in finFET in accordance with an illustrative embodiment.
Figure 11:
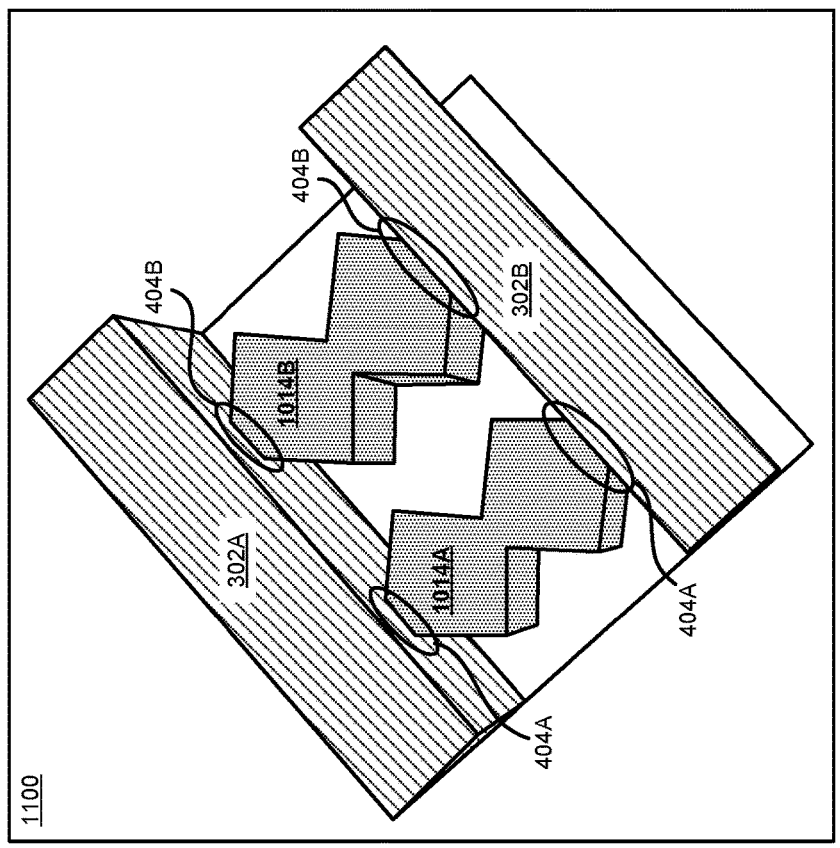
FIG. 11 depicts a block diagram of a further modified example finFET device configuration for parasitic capacitance reducing contact structure in finFET in accordance with an illustrative embodiment.
Figure 14:
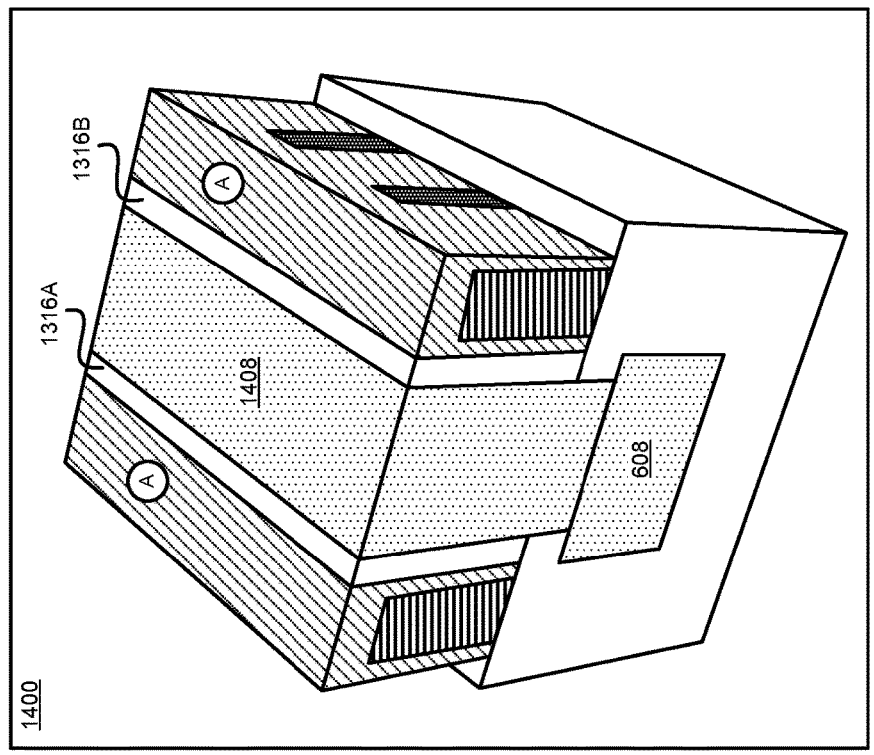
FIG. 14 depicts a block diagram of a further modified example finFET device configuration for parasitic capacitance reducing contact structure in finFET in accordance with an illustrative embodiment.
Figure 13:
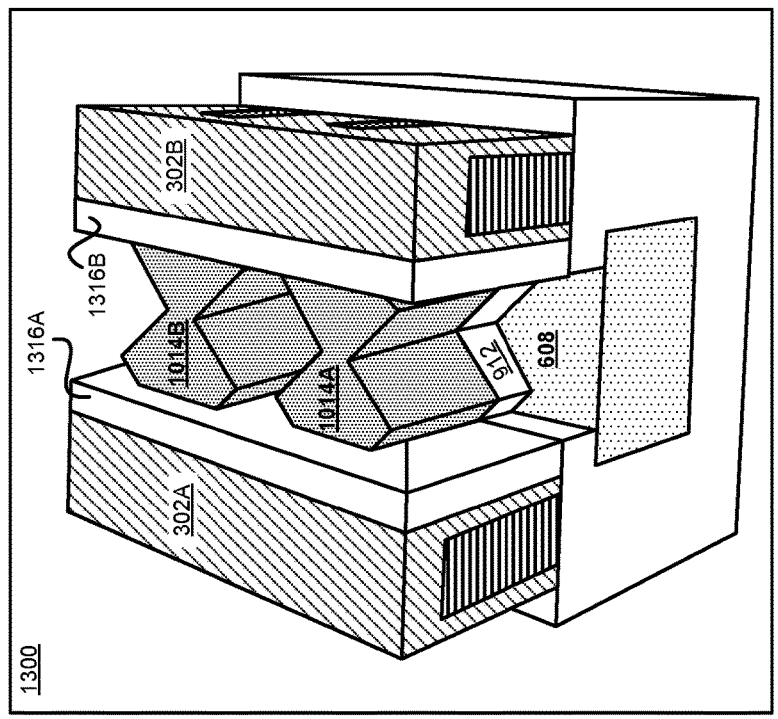
FIG. 13 depicts a block diagram of a further modified example finFET device configuration for parasitic capacitance reducing contact structure in finFET in accordance with an illustrative embodiment.
Figure 16:
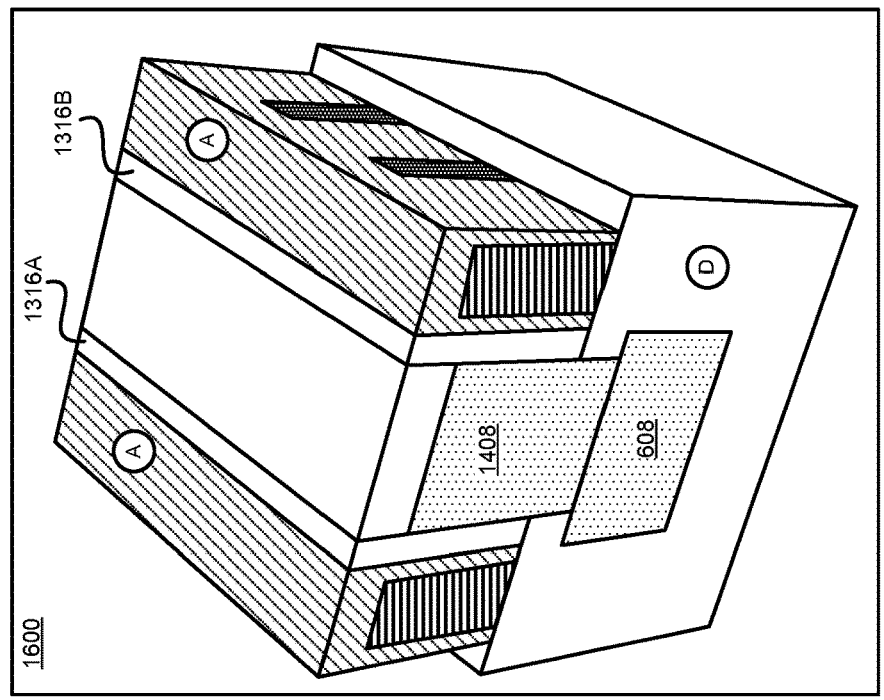
FIG. 16 depicts a block diagram of a further modified example finFET device configuration for parasitic capacitance reducing contact structure in finFET in accordance with an illustrative embodiment.
Figure 15:
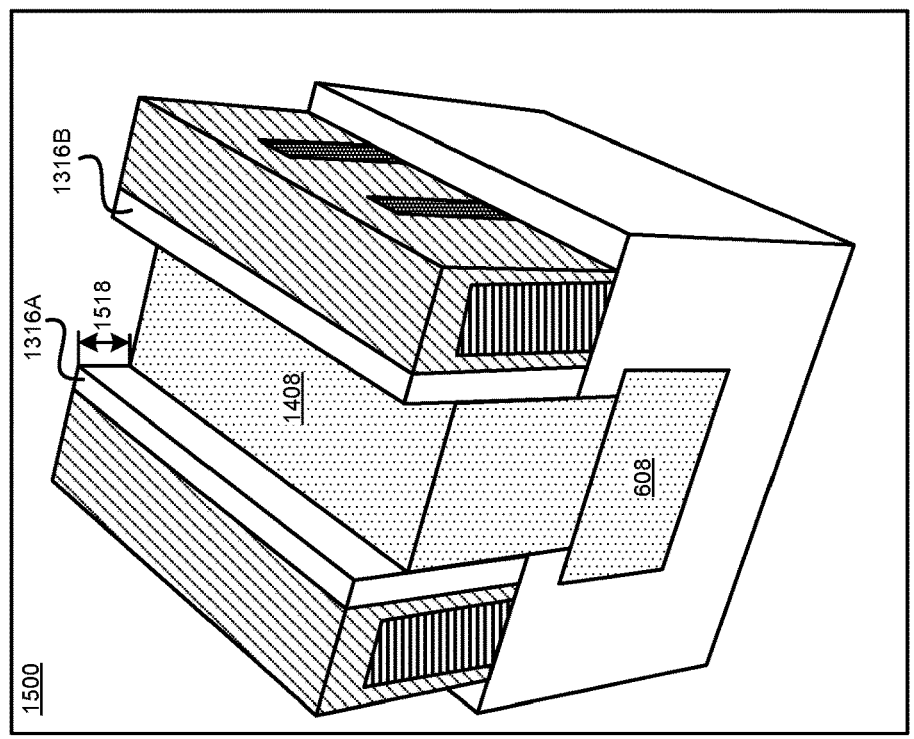
FIG. 15 depicts a block diagram of a further modified example finFET device configuration for parasitic capacitance reducing contact structure in finFET in accordance with an illustrative embodiment.

Configuration 1300 is a stage resulting from an etching or removal step applied to configuration 1200 in FIG. 12. For example, when insulator 1210 is filled up to surface A, as depicted in configuration 1200, insulator 1210 is etched or removed in the following manner—insulator material 1316A is left up to a suitable thickness on that surface of gate 302A to which epi 1014A and epi 1014B connect; insulator material 1316B is left up to a suitable thickness on that surface of gate 302B to which epi 1014A and epi 1014B connect; metal 608 is exposed between insulators 1316A and 1316B; and insulator of height 912 is left intact between epi 1014A and metal 608 (shown) and between 1014B and metal 608 (not shown).

Configuration 1400 is a stage resulting from a metal filling step applied to configuration 1300. For example, after insulation 1210 is etched as described with respect to configuration 1300, metal 1408, such as the same material as metal 608 but not limited thereto, is filled above metal 608 and at least contacting epi 1014A and 1014B. Metal 1408 may be filled above epi 1014A and 1014B, and up to surface A as shown, but the illustrative embodiments do not necessitate filling to such a level. Metal 1408 may be filled above epi 1014A and 1014B up to some level below (not shown) surface A. Metal 1408 electrically connects metal 608 to epi 1014A and 1014B. Metal 1408 remains separated from gates 302A and 302B due to insulators 1316A and 1316B, respectively.

Configuration 1500 is a stage resulting from an etching or removal step applied to configuration 1400. For example, when metal 1408 is filled up to surface A, or up to some undesirably high level while remaining below surface A, metal 1408 is etched or removed in the following manner—insulator material 1316A and 1316B are left intact; and metal 1408 is removed to desirable depth 1518 such that metal 1408 still remains electrically connected to epi 1014A and epi 1014B. Depth 1518 may expose (not shown) epi 1014A and 1014B without departing the scope of the illustrative embodiments.

Configuration 1600 is a stage resulting from an insulator filling step applied to configuration 1500. For example, after metal 1408 attains depth 1518 from surface A, insulator 1620, such as the same material as insulator 1316A or 1316B but not limited thereto, is filled above metal 1408. In one embodiment, insulator 1620 may be filled up to surface A as shown, but the illustrative embodiments do not necessitate filling to such a level. Metal 1408 and metal 608 are exposed on surface D.

Figure 17:
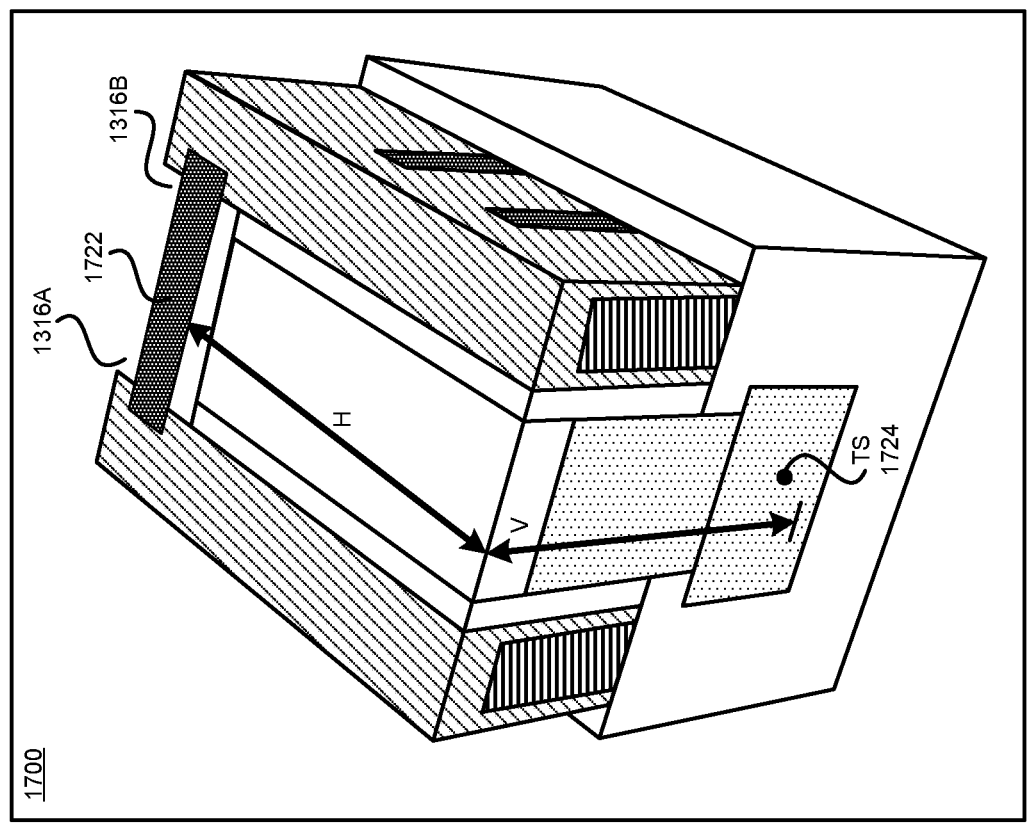
FIG. 17 depicts an example contact placement for reduced risk of short circuit and reduced parasitic capacitance in accordance with an illustrative embodiment.

With reference to FIG. 17, this figure depicts an example contact placement for reduced risk of short circuit and reduced parasitic capacitance in accordance with an illustrative embodiment. Configuration 1700 depicts an example contact placement on configuration 1600 of FIG. 16.

The depicted example placement of example contacts CB and TS according to an embodiment shows greater horizontal and vertical separation between the contacts.

Metal 1408 and 608 are electrically connected to epi 1014A and 1014B as described herein. Therefore, contacts TS that were placed using an existing method for finFET fabrication on surface B in FIG. 3 can now be moved to metal 608 and/or metal 1408 on surface D according to an embodiment. Surface D is orthogonal or substantially orthogonal to surface A, as shown. Essentially, CB contact 1722 can remain on surface A as shown, and TS contact 1724 can be located to surface D such that the relative positioning of surfaces A and D allow adding vertical separation (V) in addition to a lateral or horizontal separation (H) between contacts CB and TS.

Figure 18A:
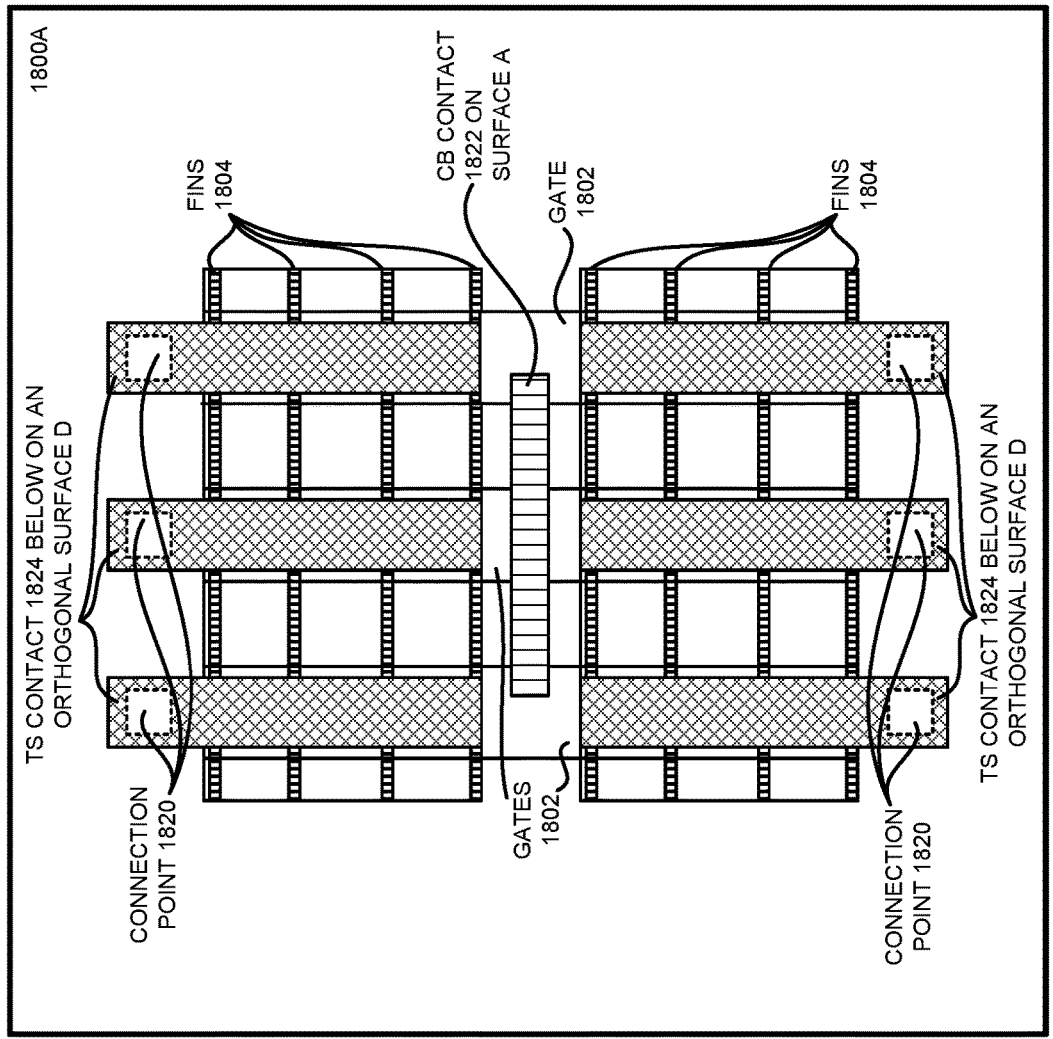
FIG. 18A depicts a top view of an example finFET with increased contact separation in accordance with an illustrative embodiment.

With reference to FIG. 18A, this figure depicts a top view of an example finFET with increased contact separation in accordance with an illustrative embodiment. Configuration 1800A is a top view of a more complex finFET but conceptually similar to a top view of configuration 1700 in FIG. 17.

For example, gates 1802 are each similar to gate 302A or 302B. Fins 1804 are each similar to fins 304A or 304B.

CB contact 1822 is similar to CB contact 1722 in configuration 1700 of FIG. 17, and is fabricated on surface A. Surface A is visible in the top view and is the part of the visible top view where CB contact 1822 is fabricated to make the necessary connections with gates 1802.

TS contact 1824 is similar to TS contact 1724 in configuration 1700 of FIG. 17, and is fabricated on surface D. Connection points 1820 are example locations where electrical connections to TS Contact 1824 are made. Surface D is orthogonal to visible surface A. Surface D can be the north face and/or the south face of the depicted structure. Surface D exposes metal 608 and/or metal 1408 as described herein. TS contact 1824 are not visible in this top view, but are fabricated at such exposed metal areas to make the necessary connections with the epi structures grown in a manner described herein.

Figure 18B:
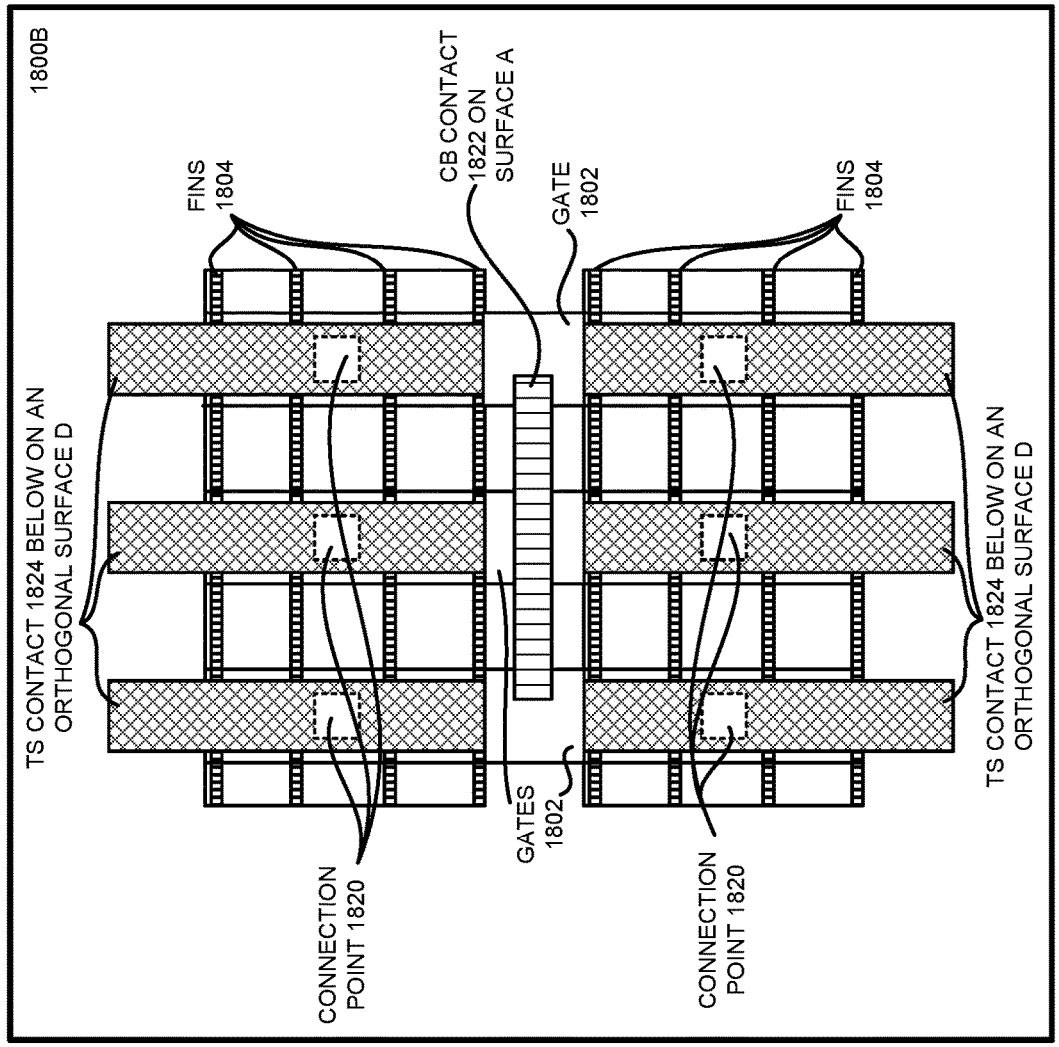
FIG. 18B depicts a top view of another example finFET with increased contact separation in accordance with an illustrative embodiment.

With reference to FIG. 18B, this figure depicts a top view of another example finFET with increased contact separation in accordance with an illustrative embodiment. Configuration 1800B is a top view of a differently configured more complex finFET but conceptually similar to a top view of configuration 1700 in FIG. 17.

Configuration 1800B shows alternative positions for connection points 1820. Connection points 1820 can similarly be moved to other places along TS contact 1824 within the scope of the illustrative embodiments.

Figure 18C:
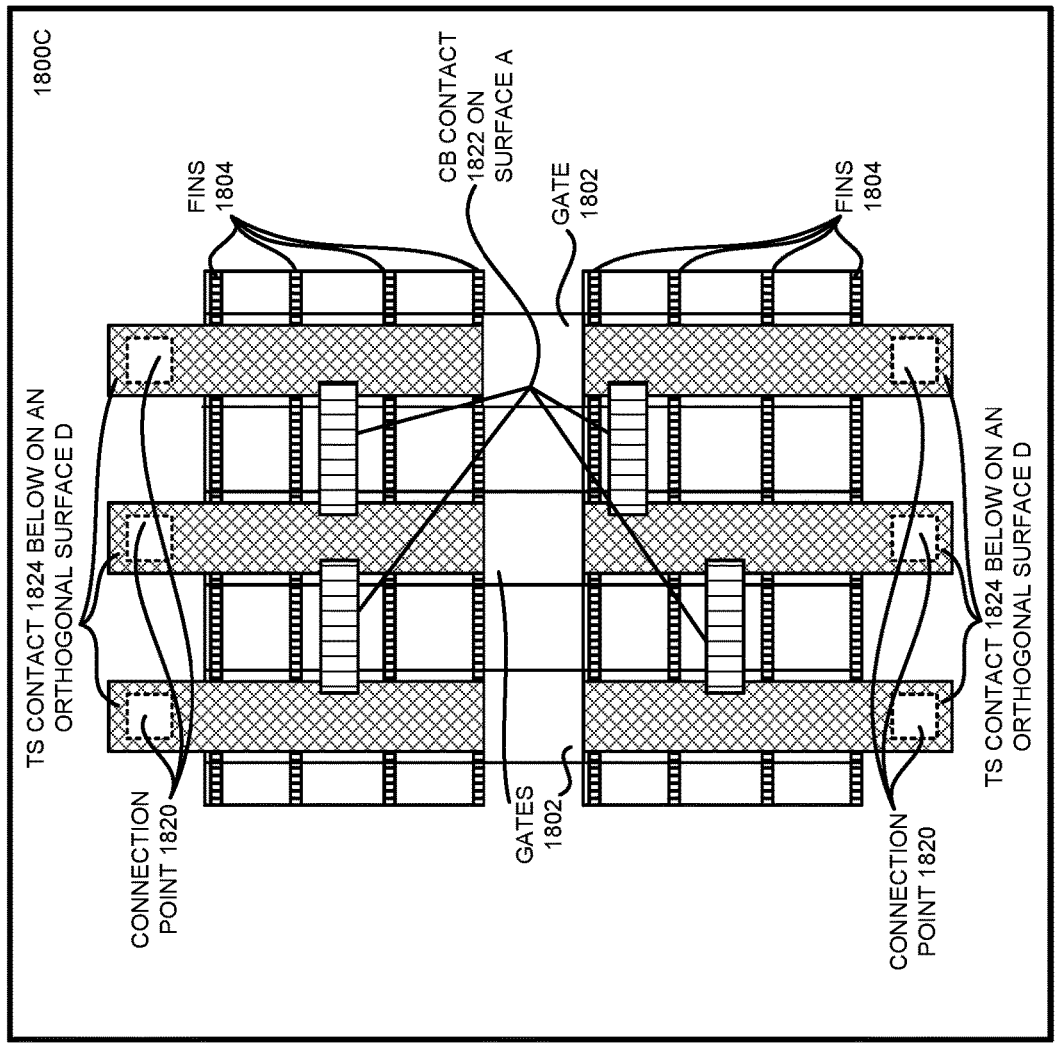
FIG. 18C depicts a top view of another example finFET with increased contact separation in accordance with an illustrative embodiment.

With reference to FIG. 18C, this figure depicts a top view of another example finFET with increased contact separation in accordance with an illustrative embodiment. Configuration 1800V is a top view of a differently configured more complex finFET but conceptually similar to a top view of configuration 1700 in FIG. 17. Configuration 1800V shows alternative positions for CB contact 1822. CB contact 1822 can similarly be split and/or moved to other places along gates 1802 within the scope of the illustrative embodiments.

Figure 19:
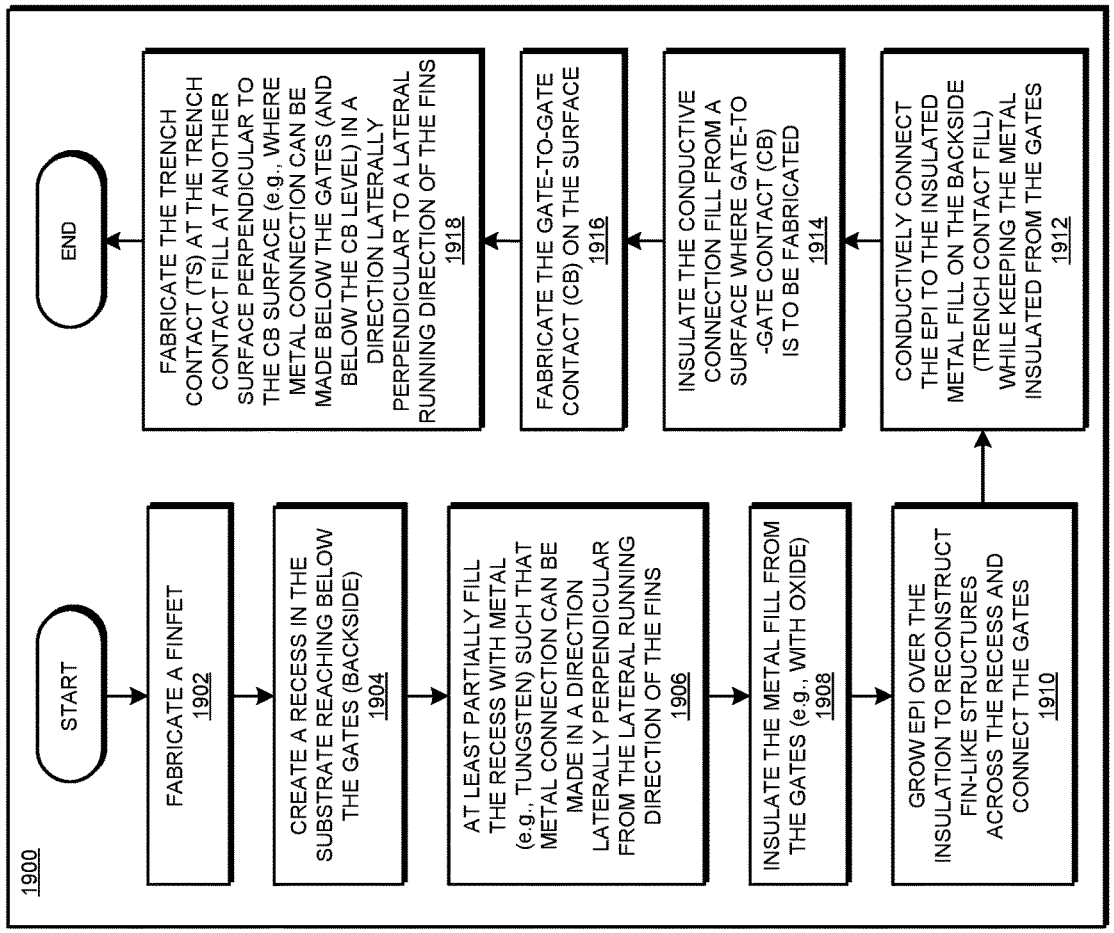
FIG. 19 depicts a flowchart of an example process for parasitic capacitance reducing contact structure in finFET in accordance with an illustrative embodiment.

With reference to FIG. 19, this figure depicts a flowchart of an example process for parasitic capacitance reducing contact structure in finFET in accordance with an illustrative embodiment. Process 1900 can be implemented in application 105 in FIG. 1, to perform one or more steps of FIGS. 3-18 as needed in process 1900.

The application performs or causes the fabrication of a finFET to be performed (block 1902). At a location where a contact with a fin has to be created, the application performs or causes the creation of a recess to be performed in the substrate, the recess reaching below the gates into the backside substrate (block 1904).

The application performs or causes at least partially filling of the recess with a conductor to be performed such that a conductive connection can be made with the conductor in a direction that is substantially laterally perpendicular from the lateral running direction of the fin (block 1906). The application performs or causes the filled metal to be insulated from the gates of the finFET (block 1908).

The application performs or causes the growth of an epitaxy structure to reconstruct a fin-like structure across the recess and reconnect the gate or gates adjacent to the recess (block 1910). The application performs or causes a conductive connection of the epi structure to the metal filling in the recess while keeping the conductive connection insulated from the gate or gates adjacent to the recess (block 1912).

The application performs or causes the insulating of the conductive connection of block 1912 from a surface where a gate-to-gate contact (CB contact) has to be fabricated (block 1914). The application performs or causes the fabrication of the gate-to-gate contact on the surface of block 1914 (block 1916).

The application performs or causes the fabrication of the fin contact (TS contact) at another surface perpendicular or substantially perpendicular to the surface of block 1914, the TS contact being in a direction that is laterally perpendicular from the lateral running direction of the fin (block 1918). The application ends process 1900 thereafter.

Thus, a computer implemented method, system or apparatus, and computer program product are provided in the illustrative embodiments for parasitic capacitance reducing contact structure in finFET and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method comprising:
    creating, in a fin-Field Effect Transistor (finFET), a recess at a location of a fin, the fin being coupled to a gate of the finFET, the recess extending into a substrate interfacing with the gate;
    filling the recess at least partially with a first conductive material;
    adjusting a height of the first conductive material in the recess such that the first conductive material remains entirely within the substrate;
    insulating the first conductive material from the gate;
    replacing the fin with a replacement structure;
    connecting electrically, using a second conductive material, the replacement structure to the first conductive material;
    insulating the second conductive material from a first surface of the finFET;
    fabricating a first electrical contact structure on the first surface; and
    fabricating a second electrical contact structure on a second surface of the finFET, the second surface being on a different spatial plane than the first surface.

2. The method of claim 1, wherein the first surface and the second surface are substantially orthogonal to each other.

3. The method of claim 2, wherein the first conductive material is electrically accessible on the second surface.

4. The method of claim 2, wherein the second conductive material is electrically accessible on the second surface.

5. The method of claim 1, wherein the second electrical contact structure provides a circuit electrically connectivity to the replacement structure.

6. The method of claim 1, wherein the first electrical contact structure provides a circuit electrically connectivity to the gate.

7. The method of claim 1, further comprising:
constructing an insulating barrier on a portion of the gate, the insulating barrier occupying a first portion of the recess.

8. The method of claim 1, further comprising:
growing an epitaxy structure at the location of the fin, wherein the epitaxy structure is the replacement structure and has a semiconducting characteristic of the fin.

9. The method of claim 1 further comprising:
causing, as a part of filling the recess at least partially with the first conductive material, the first conductive material to be exposed for making electrical connection with the fin.

10. The method of claim 1, wherein the finFET comprises a plurality of gates including the gate, and wherein a plurality of fins including the fin couple the plurality of gates.

11. A computer usable program product comprising one or more computer-readable storage devices, and program instructions stored on at least one of the one or more storage devices, the stored program instructions comprising:
program instructions to create, in a fin-Field Effect Transistor (finFET), a recess at a location of a fin, the fin being coupled to a gate of the finFET, the recess extending into a substrate interfacing with the gate;
program instructions to fill the recess at least partially with a first conductive material;
program instructions to adjust a height of the first conductive material in the recess such that the first conductive material remains entirely within the substrate;
program instructions to insulate the first conductive material from the gate;
program instructions to replace the fin with a replacement structure;
program instructions to connect electrically, using a second conductive material, the replacement structure to the first conductive material;
program instructions to insulate the second conductive material from a first surface of the finFET;
program instructions to fabricate a first electrical contact structure on the first surface; and
program instructions to fabricate a second electrical contact structure on a second surface of the finFET, the second surface being on a different spatial plane than the first surface.

12. The computer usable program product of claim 11, wherein the first surface and the second surface are substantially orthogonal to each other.

13. The computer usable program product of claim 12, wherein the first conductive material is electrically accessible on the second surface.

14. The computer usable program product of claim 11, wherein the program instructions are stored in a computer readable storage device in a data processing system, and wherein the program instructions are transferred over a network from a remote data processing system.

15. The computer usable program product of claim 11, wherein the program instructions are stored in a computer readable storage device in a server data processing system, and wherein the program instructions are downloaded over a network to a remote data processing system for use in a computer readable storage device associated with the remote data processing system.

16. A computer system comprising one or more processors, one or more computer-readable memories, and one or more computer-readable storage devices, and program instructions stored on at least one of the one or more storage devices for execution by at least one of the one or more processors via at least one of the one or more memories, the stored program instructions comprising:
program instructions to create, in a fin-Field Effect Transistor (finFET), a recess at a location of a fin, the fin being coupled to a gate of the finFET, the recess extending into a substrate interfacing with the gate;
program instructions to fill the recess at least partially with a first conductive material;
program instructions to adjust a height of the first conductive material in the recess such that the first conductive material remains entirely within the substrate;
program instructions to insulate the first conductive material from the gate;
program instructions to replace the fin with a replacement structure;
program instructions to connect electrically, using a second conductive material, the replacement structure to the first conductive material;
program instructions to insulate the second conductive material from a first surface of the finFET;
program instructions to fabricate a first electrical contact structure on the first surface; and
program instructions to fabricate a second electrical contact structure on a second surface of the finFET, the second surface being on a different spatial plane than the first surface.

* * * * *